United States Patent [19]

Wine

[11] 4,158,815

[45] Jun. 19, 1979

[54] SYSTEM FOR REDUCING THE NUMBER OF BINARY SIGNALS REPRESENTING CHANNEL NUMBERS

[75] Inventor: Charles M. Wine, Princeton, N.J.

[73] Assignee: RCA Corporation, New York, N.Y.

[21] Appl. No.: 863,919

[22] Filed: Dec. 23, 1977

[51] Int. Cl.² .............................................. H04B 1/06
[52] U.S. Cl. ..................................... 325/455; 325/464
[58] Field of Search ............... 325/455, 457, 459, 460, 325/462, 464, 465, 468; 340/172.5, 147 PC

[56] References Cited

U.S. PATENT DOCUMENTS

| | | | |
|---|---|---|---|
| 3,968,443 | 7/1976 | Leuschner | 325/455 |
| 4,005,369 | 1/1977 | Parisoe | 325/455 |
| 4,031,474 | 6/1977 | Ehni | 325/455 |

Primary Examiner—Robert L. Griffin
Assistant Examiner—Tommy P. Chin
Attorney, Agent, or Firm—Eugene M. Whitacre; Paul J. Rasmussen; Peter M. Emanuel

[57] ABSTRACT

A tuning system having a display unit displaying the channel number of a channel selected by a user in response to display information includes eight binary signals partitioned into first and second groups each of four binary signals arranged in BCD (Binary Coded Decimal) format representing the tens and units digits, respectively, of the channel number, includes a memory for storing seven binary signals partitioned into a third group of three binary signals and a fourth group of four binary signals also representing the tens and units digits, respectively, of the channel number. The third group consists of the three least significant binary signals of the first group. The fourth group consists of four binary signals having the same states as the state of the four binary signals, respectively, of the second group when the tens digit of the channel number is less than eight and otherwise having the complementary states of the states of the four binary signals, respectively, of the second group. Encoder and decoder circuits are provided for converting between the first and second groups and the third and fourth groups, respectively.

9 Claims, 1 Drawing Figure

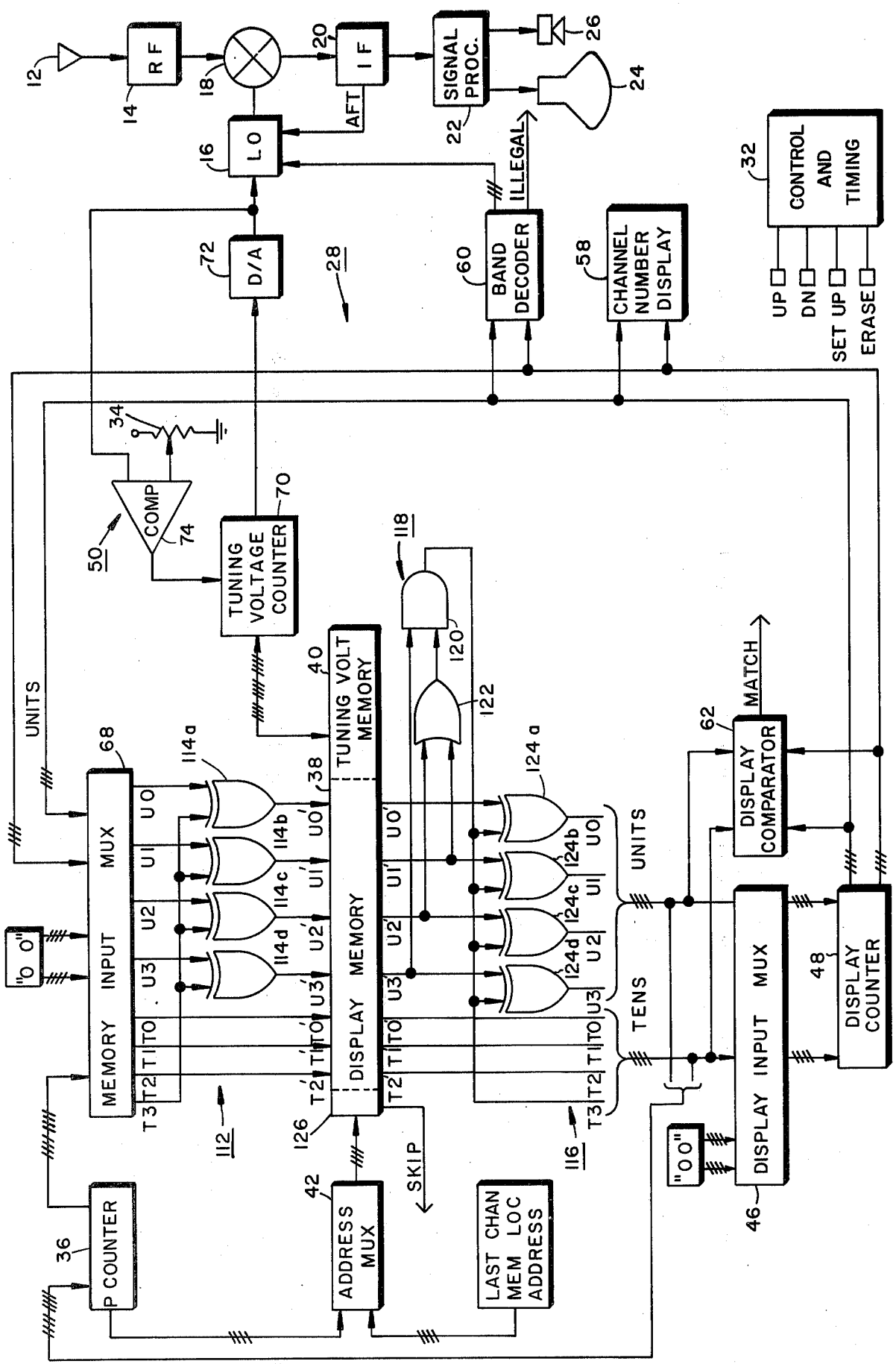

SYSTEM FOR REDUCING THE NUMBER OF BINARY SIGNALS REPRESENTING CHANNEL NUMBERS

BACKGROUND OF THE INVENTION

The present invention pertains to the field of tuning systems in which binary signals representing tuning information are processed to tune a receiver to various tuning positions including apparatus for reducing the number of binary signals required to represent the various tuning positions.

Recently numerous varieties of so-called digital tuning systems which process binary signals representing tuning information in order to tune a television receiver or the like to various tuning positions have been proposed. In digital tuning system for television receivers, apparatus is typically employed to process binary signals, usually consisting of two groups of four binary signals arranged in BCD (Binary Coded Decimal) format, representing the two decimal digits identifying the various channels a user may select. In such systems, for the sake of economy, it is often desirable to reduce the number of binary signals required to represent the channel numbers. For example, in digital tuning systems employing a memory for storing binary signals representing tuning voltage and channel number display information for later retrieval in accordance with the channel selected by a user, a reduction in the number of binary signals which the memory is required to store manifests itself in a reduction in the cost of the memory and as a result a reduction in the cost of the overall tuning system.

SUMMARY OF THE PRESENT INVENTION

A tuning system for processing eight binary signals partitioned into a first group of first, second, third and fourth binary signals corresponding to the decimal digits one, two, four and eight representing in combination the tens decimal digit of a channel number and a second group of first, second, third and fourth binary signals corresponding to the decimal digits one, two, four and eight and representing in combination the units decimal digit of the channel number, includes utilization means for processing, e.g., storing or coupling, seven binary signals partitioned into a third group of first, second and third binary signals corresponding to the decimal digits one, two and four representing in combination the tens digit of the channel number and a fourth group of first, second, third and fourth binary signals corresponding to the decimal digits one, two, four and eight representing in combination the tens digit of the channel number and at least one conversion means for converting between the first and second groups and the third and fourth groups, respectively. The first, second and third binary signals of the third group have the same binary states as said first, second and third binary signals of the first group, respectively. The first, second, third and fourth binary signals of the fourth group have the same binary states as the first, second, third and fourth binary signals, respectively, of the second group when the first group of binary signals represent in combination a decimal number less than eight and otherwise have the complementary binary states of the states of the first, second, third and fourth binary signals, respectively, of the second group.

BRIEF DESCRIPTION OF THE DRAWING

The sole FIGURE of the drawing shows a television receiver employing a tuning system including a memory for storing binary signals representing tuning information and code conversion circuits constructed in accordance with the present invention used to reduce the number of binary signals stored in the memory.

DETAILED DESCRIPTION OF THE DRAWING

In the television receiver of the FIGURE, radio frequency (RF) signals received by an antenna 12 are amplified and otherwise processed by an RF input unit 14 and thereafter combined with a local oscillator signal developed by a local oscillator 16 by a mixer 18 to form an intermediate frequency (IF) signal. The frequency of the local oscillator signal is controlled by a tuning system 28 in accordance with the channel presently selected by a user. The IF signal is filtered and otherwise processed in an IF unit 20 and thereafter coupled to a signal processing unit 22 where signals representing synchronization, luminance, color and sound information are derived therefrom. An image is developed by a picture tube 24 in response to the signals representing synchronization, luminance and color information. An audio response is developed by a speaker 26 in response to the signals representing sound information. IF unit 20 also generates an AFT (Automatic Fine Tuning) signal which is coupled to local oscillator 16 to correct for frequency deviations between the IF signal and a standard IF frequency, e.g., 45.75 MHz in the United States, which may arise in response to component value changes within tuning system 28.

The frequency determining element of local oscillator 16 includes at least one varactor diode which is reverse biased by a DC tuning voltage to exhibit a capacitance determined by the magnitude of the tuning voltage. Local oscillator 16 typically includes several varactor diodes corresponding to the various bands in which a selected channel may reside. For example, in the United States where channels 2 through 83 are partitioned into three bands, local oscillator 16 may include a varactor diode arrangement for the low VHF (VL) band including channels 2-6, another varactor diode arrangement for the high VHF (VH) band including channels 7-13, and still another varactor diode arrangement for the UHF (U) band including channels 14-83.

The tuning voltage and the bandswitching signals for local oscillator 16 are derived by a memory type tuning system 28. Tuning system 28 includes a nonvolatile memory 38/40 with memory locations for storing binary signals representing information corresponding to a limited number of respective channels, e.g., 16, less than the total number of channels available in the television frequency range, e.g., 82 in the United States. Each memory location within the memory 38/40 is partitioned into a display portion 38 for storing binary signals for displaying the channel number of an associated channel and a tuning voltage portion 40 for storing binary signals for generating the DC tuning voltage for the associated channel. Tuning system 28 is a content address tuning (CAT) system. This means that tuning information for consecutively numbered channels may be stored in non-consecutive memory locations.

Tuning system 28 has a normal mode of operation during which a user may select a channel for normal viewing causing binary signals to be retrieved from the corresponding memory location of memory 38/40 and processed to generate the tuning voltage and channel number display for the selected channel and a setup mode of operation during which the binary signals representing channel number display and tuning voltage information for the various channels preferred by a user are generated in response to user control and stored in respective memory locations of memory 38/40 for later retrieval. The operation of tuning system 28 is controlled by a user by means of UP, DN (DowN), ERASE and SETUP switches. In response to the operation of these switches, a control and timing unit 32 generates internal timing and control signals to control the interaction of various portions of tuning system 28. The functional operation of tuning system 28 is described below. For a detailed description of the interconnections between and implementations of various portions of tuning system 28, with the exception of encoder 112 and decoder 116, constructed in accordance with the present invention, reference should be made to copending U.S. patent application Ser. No. 810,876 filed on June 28, 1977, in the name of the same inventor as the present inventor, which is hereby incorporated by reference.

In the normal mode of operation of tuning system 28, when a user presses one of the UP or DN push buttons, a display counter 48 generates binary signals representing consecutive channel numbers between 2 and 83. At each count of display counter 48, memory 38/40 is searched for a memory location in which binary signals representing the same channel number as that represented by the binary signals presently generated by display counter 48 are stored in its display memory portion 38. During the search process, a P (Pointer) counter 36 generates binary signals representing the sequential addresses of the memory locations of memory 38/40. At each count of P counter 36 a display comparator 62 compares the binary signals generated by display counter 48 and the binary signals stored in display memory portion 38 of the presently addressed memory location for a channel number match. If all the memory locations of memory 38/40 have been searched, and a channel number match has not been found, the count in display counter 48 is increased or decreased (depending on whether UP or DN push button has been depressed) and memory 38/40 is again searched.

When a channel number match is found, the search is terminated. At this point, the binary signals contained in display counter 48 of the presently addressed memory location are processed by channel number display unit 58 to display a corresponding two decimal digit channel number and are also processed by a band decoder 60 to generate the appropriate varactor bandswitching signal for local oscillator 16. In addition, the binary signals stored in tuning voltage memory portion 40 of the presently addressed memory location are coupled to a tuning voltage generator 50 and converted to the appropriate DC tuning voltage for local oscillator 16.

When a channel has been selected in the normal operation mode of operation of tuning system 28 in the aforesaid manner, the contents of P counter 36, representing the address of the presently selected channel, are coupled through a memory input MUX (multiplexer) 68 to a last channel memory location of memory 38/40 designed for that purpose and stored therein. In this way, the address of the memory location which contains display and tuning information for the last selected channel is stored in memory 38/40 for later retrieval. If the receiver is then turned off, when the receiver is again turned on, the address of the last channel memory location of memory 38/40 is coupled to memory 38/40 through an address input MUX 42 so that the last channel memory of memory 38/40 is addressed. As a result, the contents of the last channel memory location are coupled to P counter 36 and the memory location of the last channel selected before the receiver was turned off is addressed so that the last channel selected before the receiver was turned off is automatically selected.

To enter channel display and tuning information into memory 38/40, a user places the setup switch into a setup position. At this point, memory 38/40 is searched to find a memory location in which binary signals representing an illegal channel number, that is a channel number not between 2 and 83, are stored in its display memory portion 38. Since an illegal channel number does not reside in any of the bands VL, VH or U, band decoder 60 is utilized for this purpose. The search for a memory location containing binary signals representing an illegal channel number corresponds to a search for an unused or empty memory location into which new information may be entered. When a memory location containing binary signals representing an illegal channel number is found, binary signals representing the two digit decimal number "00" are coupled through a display input MUX 46 to display counter 48 so that the channel number display displays the decimal number "00" to indicate to a user that an unused memory location in which he may enter a new channel has been located.

A user next adjusts potentiometer 34 of tuning voltage generator 50 until the picture and sound are satisfactory. The setting of potentiometer 34 is converted into a DC tuning voltage and binary signals representing this DC tuning voltage are generated by a tuning voltage counter 70, a D-A (digital to analog) converter 72, and a voltage comparator 74 of tuning voltage generator 50. The output of comparator 74 causes the value represented by the binary signals generated by tuning voltage counter 70 to increase or decrease until the tuning voltage generated by D-A converter 72 equals the voltage determined by the setting of potentiometer 34.

Then, by operating either UP or DN push button, the user causes the contents of display counter 48 to be changed until the channel number corresponding to the station for which the tuning voltage has just been adjusted is displayed by channel number display 58. The viewer then places the setup switch to its normal position.

At this point, memory 38/40 is searched to determine if a channel number match exists between the binary signals presently generated by display counter 48 and the binary signals stored in display portion 38 of a memory location. The occurrence of a channel number match means that tuning information for the channel presently being programmed has already been stored in a memory location of memory 38/40. So that the address of the unused memory location is not lost during the search for a channel number match, the address of the unused memory location is coupled from P counter 36 through memory input MUX 68 to the last channel memory location of memory 38/40, referred to above in connection with the last channel selected feature of tuning system 28, so that it is temporarily stored while the contents of P counter 36 are changed to search memory 38/40 for a channel number match. If a channel number match is detected, the newly programmed information is stored in the memory location for which the channel number match exists. If a channel number match is not detected, the newly programmed information is stored in the unused memory location located in the manner set forth above. This operation prevents the use of more than one memory location for storing information for the same channel, thereby undesirably decreasing the number of available memory locations.

If a user wishes to erase information for a channel, for example, to make room in memory 38/40 for a new channel when the viewing locality of a receiver has been changed, during the normal viewing mode he depresses either the UP or DN switch until the channel number for the channel to be erased is displayed by channel number display 58. At this point, he depresses the ERASE switch. As a result, binary signals representing the decimal number "00" are coupled through memory input multiplexer 68 to display memory portion 38 of the presently addressed memory location corresponding to the channel to be erased. Since "00" is an illegal channel number, the memory location storing this illegal channel number will be automatically skipped during the normal mode of operation of tuning system 28 and will also be available for the storage of information related to a new channel during the setup mode of operation of tuning system 28. After a previously stored channel has been erased or deleted, tuning system 28 automatically causes the memory location for the next channel to be located.

In the FIGURE, multiple conductors are distinguished from single conductors by slash marks representing the number of conductors in a multiple conductor. Thus, for example, four slash marks are used to indicate that four binary signals representing the sixteen addresses for the sixteen memory locations of memory 38/40 are generated by P counter 36 and coupled to memory 38/40 through address input MUX 42. Similarly, twelve slash marks are used to indicate that twelve binary signals are coupled between tuning voltage memory 40 to D-A converter 72 and three slash marks are used to indicate that three binary signals corresponding to band switching signals (VL, VH and U) are coupled from band decoder 60 to local oscillator 16. In this condition, it will be noted that display counter 48 generates eight binary signals partitioned into a first group of four binary signals T0, T1, T2 and T3 corresponding to the decimal digits $2^0=1$, $2^1=2$, $2^2=4$ and $2^3=8$, respectively, and arranged in BCD (Binary Coded Decimal) format (see Table 1 below) to represent, in combination, the tens digits of the channel numbers and a second group of four binary signals U0, U1, U2 and U3, corresponding to the decimal digits $2^0=1$, $2^1=2$ $2^2=4$, and $2^3=8$, respectively, and also arranged in BCD format to represent, in combination, the units digits of the channel numbers. Since the channel numbers are represented by eight binary signals or bits (binary digits), it would be expected that display memory portion 38 of each memory location would have to be capable of storing eight bits. Since the cost of memory 38/40 is related to the number of bits which it is required to store, it is desirable that display memory portion 38 of each memory location be required to store as few bits as possible. To this end, tuning system 28 includes an encoder 112 for converting the eight binary signals representing the channel to seven binary signals representing the channel number prior to storage in display memory portion 38 of a corresponding memory location and a decoder 116 for reconverting the seven binary signals stored in display portion 38 to the original eight binary signals before they are coupled to various portions of tuning system 28 for further processing in the various modes of operation described above. As a result, display memory portion 38 of each memory location need only store seven (rather than eight) bits and a saving of a one bit per memory location is achieved.

Specifically, the seven binary signals generated by encoder 116 are partitioned into a third group of three binary signals T0', T1' and T2' corresponding to the decimal digits $2^0=1$, $2^1=2$, $2^2=4$, respectively, and representing, in combination, the tens decimal digit of the channel number and a fourth group of four binary signals U0', U1', U2' and U3' corresponding to the decimal digits $2^0=1$, $2^1=2$, $2^2=4$ and $2^3=8$, respectively, and representing, in combination, the units decimal digit of the channel number. The three binary signals T0', T1' and T2' of the third group of binary signals have the same states as the states of the least significant binary signals T0, T1 and T2, respectively, of the first group of binary signals (the most significant binary signal T3 of the first group being deleted). The four binary signals U0', U1', U2' and U3' of the fourth group of binary signals generated by endoder 112 have the same states as the states of the four binary signals U0, U1, U2 and U3, respectively, of the second group when the channel number is less than 80 and the complementary states of the states of the four binary signals U0, U1, U2 and U3, respectively, of the first group of binary signals (i.e., four binary signals of the fourth group represent the "1s" complement of the BCD representation of the units decimal digit) when the channel number is 80 or greater. To accomplish the code conversion from the first and second groups to the third and fourth groups, respectively, encoder 112 includes "exclusive or" gates 114a, 114b, 114c and 114d for selectively inverting the binary signals U0, U1, U2 and U3, respectively, only when T3 is a binary 1. To understand the selective inversion operation of "exclusive or" gates 114a, 114b, 114c and 114d, it will be recalled that the truth table for an "exclusive or" gate is as follows:

| Input 1 | Input 2 | Output |
|---------|---------|--------|
| 0 | 0 | 0 |
| 0 | 1 | 1 |
| 1 | 0 | 1 |
| 1 | 1 | 0 |

The code formats for channels 80-83 are shown in table 2 below. It is noted that if the channel number is between 2 and 79, its binary representation is left unaltered by encoder 112 except that the most significant binary digit for the tens decimal digit, T3, which is a binary "0" for the numbers 2 to 79, is deleted.

To reconvert the third and fourth groups of binary signals stored in the display memory 38 of an addressed memory location to the first and second groups of binary signals, respectively, decoder 116 couples a binary "0" to the T3 position of the first group when the binary signals of the fourth group represent in BCD format a decimal number between 0 and 9; couples a binary "1" to the T3 position of the first group when the binary signals of the fourth group do not represent in BCD format a decimal number between 0 and 9; couples the three binary signals T0', T1' and T2' of the third group (which are equal to T0, T1 and T2 of the first group) in unaltered form to the respective positions of the binary signals T0, T1 and T2 of the first group; couples the binary signals U0', U1', U2' and U3' of the fourth group in unaltered form to the respective positions of the binary signals U0, U1, U2 and U3 of the second group when the binary signals of the fourth group represent in BCD format a decimal number between 0 and 9; and couples the binary complements of the binary signals U0', U1', U2' and U3' of the fourth group to the respective positions U0, U1, U2, and U3 of the second group when the binary signals of the fourth group do not represent in BCD format a decimal number between 0 and 9. As is indicated in table 1 under the column labelled "BCD Format", none of the BCD code formats (for the decimal digits 0–9) have both a binary "1" in the $2^3$ position and a binary "1" in either the $2^2$ or $2^1$ position. Thus, a detector 118 of decoder 116, utilized to detect when the binary signals of the fourth group represent in BCD format a decimal digit between 0 and 9, includes an "and" gate 120 and an "or" gate 122 arranged to generate a binary "1" when U3' and at least one of U2' and U1' of the fourth group of binary signals are binary "1s" and otherwise generate a binary "0". The binary signal generated by detector 118 is coupled to the T3 position of the first group of binary signals. The binary signal generated by detector 118 is also coupled to one of the inputs of a group of "exclusive or" gates 124a, 124b, 124c and 124d. The binary signals U0, U1, U2 and U3 are coupled to the other inputs of "exclusive or" gates 124a, 124b, 124c and 124d. The binary signals U0, U1, U2 and U3 of the second group are generated at the outputs of "exclusive or" gates 124a, 124b, 124c and 124d, respectively, and as a result of their operation (see the truth table above) have the same states as the states of the binary signals U0', U1', U2' and U3', respectively, of the fourth group when the binary signal (T3) generated at the output of detector 118 is a binary "0" and have the complementary states of the states of the binary signals U0', U1', U2' and U3', respectively, of the fourth group when the binary signal generated at the output of detector 118 is a binary "1".

It will be noted from the column of table 1 labelled "'1s' Complement", that the "1s" complements of the BCD code formats for the decimal digits 8 and 9 correspond to the BCD code formats for the decimal digits 7 and 6, respectively. However, this presents no problem to the operation of detector 118 since the highest channel number utilized is 83 and therefore the "1s" complement of the BCD code formats for 8 and 9 will never be utilized.

Table 1

| Decimal Number | BCD Format | | | | "1s" Complement | | | |
|---|---|---|---|---|---|---|---|---|
| | $2^3$ | $2^2$ | $2^1$ | $2^0$ | $2^3$ | $2^2$ | $2^1$ | $2^0$ |
| 0 | 0 | 0 | 0 | 0 | 1 | 1 | 1 | 1 |
| 1 | 0 | 0 | 0 | 1 | 1 | 1 | 1 | 0 |
| 2 | 0 | 0 | 1 | 0 | 1 | 1 | 0 | 1 |
| 3 | 0 | 0 | 1 | 1 | 1 | 1 | 0 | 0 |
| 4 | 0 | 1 | 0 | 0 | 1 | 0 | 1 | 1 |
| 5 | 0 | 1 | 0 | 1 | 1 | 0 | 1 | 0 |

Table 1-continued

| Decimal Number | BCD Format | | | | "1s" Complement | | | |
|---|---|---|---|---|---|---|---|---|
| | $2^3$ | $2^2$ | $2^1$ | $2^0$ | $2^3$ | $2^2$ | $2^1$ | $2^0$ |
| 6 | 0 | 1 | 1 | 0 | 1 | 0 | 0 | 1 |
| 7 | 0 | 1 | 1 | 1 | 1 | 0 | 0 | 0 |
| 8 | 1 | 0 | 0 | 0 | 0 | 1 | 1 | 1 |
| 9 | 1 | 0 | 0 | 1 | 0 | 1 | 1 | 0 |

Table 2

| Channel No. | T3 | T2 | T1 | T0 | U3 | U2 | U1 | U0 | T2' | T1' | T0' | U3' | U2' | U1' | U0' |
|---|---|---|---|---|---|---|---|---|---|---|---|---|---|---|---|
| 80 | 1 | 0 | 0 | 0 | 0 | 0 | 0 | 0 | 0 | 0 | 0 | 1 | 1 | 1 | 1 |
| 81 | 1 | 0 | 0 | 0 | 0 | 0 | 0 | 1 | 0 | 0 | 0 | 1 | 1 | 1 | 0 |
| 82 | 1 | 0 | 0 | 0 | 0 | 0 | 1 | 0 | 0 | 0 | 0 | 1 | 1 | 0 | 1 |
| 83 | 1 | 0 | 0 | 0 | 0 | 0 | 1 | 1 | 0 | 0 | 0 | 1 | 1 | 0 | 0 |

It is noted that because of the manner in which encoder 112 converts eight binary signals representing a channel number to seven binary signals and decoder 116 reconverts the seven binary signals to the original eight, it is possible to store binary signals representing information other than channel number information in display memory portion 38 of a memory location. Thus, it is possible to utilize display memory portions 38 of a memory location to store binary signals representing the two digit decimal number "00" coupled to it from memory MUX 68 to indicate that the memory location is an unused or empty memory location in the manner set forth above. Similarly, it is possible to couple four binary signals representing the address of a memory location generated by P counter 36 to display portion of a designated memory location, such as the last channel memory location, through memory input MUX 68 for temporarily storing them for later retrieval as described with reference to the feature of tuning system 28 whereby the last channel selected prior to the receiver being turned off or the feature of tuning system 28 whereby during the setup mode of operation the address of an unused memory location for storing channel number and tuning voltage information for a new channel is temporarily stored while the memory is searched for duplicate information to avoid using more than one memory location for the same information.

While the bit-per-memory location saving benefit of the encoding format set forth above may be enjoyed in terms of reducing the number of bits required in a memory, it may also be enjoyed in the form of making bits of a memory normally utilized for storing channel display information available for storing other information. For example, by utilizing the present code conversion arrangement, one bit in each memory location of an eight bit per memory location memory for normally storing eight binary signals representing channel numbers may be saved (such as a bit position 126 of display memory 38 corresponding to binary signal T3 which is saved because T3 is not required to be stored) and utilized to store a binary signal representing whether the corresponding channel should be automatically skipped during channel selection (because of its program content or reception quality) or not. This feature is particularly useful in a tuning system in which at least some of the memory locations of the memory are programmed with tuning and channel number display information corresponding to a certain group of channels, e.g., the VHF channels by the manufacturer to minimize user setup. In this situation, nonpreferred preprogrammed channels may be deleted without causing the loss of the corresponding tuning information and retrieved (without reprogramming the tuning voltage and channel number display information) by controlling the state of the binary signal stored in the "saved" bit position.

In addition, while the present code conversion arrangement has been described in terms of a tuning system including both an encoder and decoder, it should be appreciated that the encoder could be omitted from a tuning system including a display memory preprogrammed by a manufacturer to store binary signals encoded according to the principals set forth above to represent two digit channel numbers and a decoder for decoding the stored binary signals. Furthermore, while the present code conversion arrangements for reducing the number of binary signals representing a two digit number have been described in terms of a tuning system including a memory in which it is desired to save memory bits, it should be appreciated that these code conversion arrangements could as well be utilized to save the number of conductors required for coupling binary signals representing two digits between two locations. These and other modifications to the present invention are contemplated to be within the scope of the present invention as set forth in the following claims.

What is claimed is:

1. In a tuning system, apparatus comprising:
   first means for processing a first coded arrangement of binary signals partitioned into first and second groups of binary signals representing the tens and units decimal digits, respectively, of a channel number, each of said first and second groups consisting of first, second, third and fourth binary signals corresponding to the decimal digits one, two, four and eight, each of said binary signals having one of a first state indicating the presence of the corresponding decimal digit in determining said channel number or a second state which is the complement of said first state and indicating the absence of the corresponding decimal digit in determining said channel number; and
   second means for processing a second coded arrangement of binary signals partitioned into third and fourth groups of binary signals representing the tens and units decimal digit, respectively, of said channel number, said third group consisting of first, second and third binary signals corresponding to the decimal digits one, two and four, respectively, and having the same states as the states of said first, second and third binary signals, respectively, of said first group of binary signals, said fourth group of binary signals consisting of first, second, third and fourth binary signals corresponding to the decimal digits one, two, four and eight, respectively, and having the same states as the states of said first, second, third and fourth binary signals, respectively, of said second group when the tens decimal digit of said channel number is less than eight and otherwise having states which are the complements of the states of said first, second, third and fourth binary signals, respectively, of said second group; and
   code conversion means for converting one of said first and second coded arrangements of binary signals to the other of said first and second coded arrangements of binary signals.

2. The apparatus recited in claim 1 wherein said code conversion means includes decoder means responsive to said third and fourth groups of binary signals for deriving said first and second groups of binary signals, said first, second and third binary signals of said first group having the same states as said first, second and third binary signals, respectively, of said third group, said fourth binary signals of said fourth group having said second state when said fourth group of binary signals represents a decimal number between zero and nine and otherwise having said first state, said first, second, third and fourth binary signals of said second group having the same states as the states of said first, second, third and fourth binary signals, respectively, of said fourth group when said fourth group of binary signals represents a decimal number between zero and nine and otherwise having states which are the complements of the states of said first, second, third and fourth binary signals, respectively of said first, second and third binary signals of said fourth group.

3. The apparatus recited in claim 2 wherein:
said decoder means includes first, second, third and fourth "exclusive or" gate means, each of said "exclusive or" gate means having first and second input terminals and an output terminal, said first, second, third and fourth binary signals of said fourth group being coupled to the first input terminals of said first, second, third and fourth "exclusive or" gates, respectively, said first, second, third and fourth binary signals of said second group being generated at said output terminals of said first, second, third and fourth "exclusive or" gates, respectively, said fourth binary signal of said first group being coupled to the second input, said binary signals generated at said output terminals of said "exclusive or" gate means having said first state when one of the binary signals coupled to one of said respective input terminals has said first state and the binary signal coupled to the other of said respective input terminals has said second state and otherwise having said second state.

4. The apparatus recited in claim 3 wherein:
said decoder means includes detector means responsive to said fourth, third and second binary signals of said fourth group for generating said fourth binary signal of said first group, said fourth binary signal of said first group having said first state when said fourth binary signal and at least one of said third and second binary signals of said fourth group have said first state and otherwise having said second state.

5. The apparatus recited in claim 2 wherein:
said second means includes channel number memory means for storing said third and fourth groups of binary signals.

6. The apparatus recited in claim 2 wherein:
said conversion means includes encoding means responsive to said first and second groups of binary signals for generating said third and fourth groups of binary signals.

7. The apparatus recited in claim 6 wherein said encoding means includes first, second, third and fourth "exclusive or" gate means each having first and second input terminals and an output terminal, said first, second, third and fourth binary signals of said second group being coupled to said first input terminals of said first, second, third and fourth "exclusive or" gate means, respectively, said fourth signal of said first group being coupled to said second input terminal of said first, second, third and fourth "exclusive or" gate means, said first, second, third and fourth binary signals of said fourth group being generated at said output terminals of said first, second, third and fourth "exclusive or" gate, respectively;

said decoder means includes fifth, sixth, seventh and eighth "exclusive or" gate means each having first and second input terminals and an output terminal, said first, second, third and fourth binary signals of said fourth group being coupled to said first input terminals of said fifth, sixth, seventh and eighth "exclusive or" gate means, respectively, said fourth binary signal of said first group being coupled to said second input terminals of said first, second, third and fourth "exclusive or" gate means, said first, second, third and fourth binary signals of said second group being generated at said output terminals of said fifth, sixth, seventh and eighth "exclusive or" gate means, respectively;

said binary signals generated at said output terminals of said exclusive or gate means of said encoder and decoder means having said first state when one of said binary signals coupled to said respective input terminals has said first state and the other of said input signals has said second state, otherwise said binary signals generated at said output terminals of said "exclusive or" gate means of said encoder and decoder means having said second state.

8. The apparatus recited in claim 7 wherein said decoder means includes detector means responsive to said fourth, third and second binary signals of said fourth group for generating said fourth binary signal of said first group; said fourth signal of said first group having said first state when said fourth binary signal and at least one of said third and second binary signals of said sixth group have said first state and otherwise having said second state.

9. The apparatus recited in claim 7 wherein:
said first means includes channel number counter means for generating said first and second groups of binary signals; and
said second means includes channel number memory means for storing said third and fourth groups of binary signals.

* * * * *

UNITED STATES PATENT AND TRADEMARK OFFICE
CERTIFICATE OF CORRECTION

PATENT NO. : 4,158,815
DATED : June 19, 1979
INVENTOR(S) : Charles M. Wine

It is certified that error appears in the above—identified patent and that said Letters Patent is hereby corrected as shown below:

Column 2, line 51, that portion reading "38/40" should read -- 28/40 --.

Column 5, line 45, that portion reading "condition" should read -- connection --.

*Signed and Sealed this*

*Twenty-seventh* Day of *November 1979*

[SEAL]

Attest:

RUTH C. MASON
*Attesting Officer*

LUTRELLE F. PARKER
*Acting Commissioner of Patents and Trademarks*